United States Patent [19]
Shimasaki et al.

[11] Patent Number: 6,083,426
[45] Date of Patent: Jul. 4, 2000

[54] CONDUCTIVE PASTE

[75] Inventors: Yukihiro Shimasaki, Sanda; Yusuke Ozaki, Toyonaka; Masanaru Hasegawa, Yawata; Toshiyuki Kitagawa, Sakai-gun, all of Japan

[73] Assignee: Matsushita Electric Industrial Co., Ltd., Osaka, Japan

[21] Appl. No.: 09/327,833

[22] Filed: Jun. 8, 1999

[30] Foreign Application Priority Data

Jun. 12, 1998 [JP] Japan .................................. 10-164903

[51] Int. Cl.[7] .............................. H01B 1/00; H01C 7/10
[52] U.S. Cl. ...................... 252/500; 252/511; 252/519.3; 338/22 R; 338/223
[58] Field of Search ..................................... 252/500, 502, 252/510, 511, 512, 519.33, 519.3; 338/22 R, 223–225

[56] References Cited

U.S. PATENT DOCUMENTS

| | | | |
|---|---|---|---|
| 4,686,144 | 8/1987 | Hupfer et al. | 428/421 |
| 5,475,359 | 12/1995 | Hatayama et al. | 338/160 |
| 5,502,143 | 3/1996 | Oie et al. | 528/12 |

FOREIGN PATENT DOCUMENTS

| | | |
|---|---|---|
| 52-12459 | 1/1975 | Japan . |
| 54-78492 | 6/1979 | Japan . |
| 54-136694 | 10/1979 | Japan . |
| 58-7473 | 1/1983 | Japan . |
| 60-176006 | 9/1985 | Japan . |
| 3-233904 | 10/1991 | Japan . |
| 3-242311 | 10/1991 | Japan . |
| 4-324601 | 11/1992 | Japan . |
| 10-189307 | 7/1998 | Japan . |

*Primary Examiner*—Mark Kopec
*Assistant Examiner*—Derrick G. Hamlin
*Attorney, Agent, or Firm*—Merchant & Gould P.C.

[57] ABSTRACT

A conductive paste having excellent printing properties, which can be used for manufacturing heat-resistant conductors and resistive elements, is described. Such a conductive paste can be obtained by preparing as a binder a polyimide precursor whose weight average degree of polymerization (n) ranges from 5 to 20, and mixing it with a solvent and a conductive powder. The polyimide precursor preferably is included in the range from 50 to 80 weight parts to 100 weight parts of the solvent. A polar solvent, or a mixed solvent including a polar solvent and a nonpolar solvent can be used. A preferable mixed solvent is a mixture of N-methyl-2-pyrrolidone and diethylene glycol dimethyl ether, in which the mixing volume ratio is preferably ranging from 2:8 to 9:1, more preferably, 2:8 to 3:7.

16 Claims, No Drawings

CONDUCTIVE PASTE

FIELD OF THE INVENTION

The present invention relates to a conductive paste used for manufacturing electric resistive films, electroconductive films or the like. More specifically, this invention relates to a conductive paste that comprises a polyimide precursor as a binder and that is used for manufacturing electric resistive films, electroconductive films or the like having high heat-resistance.

BACKGROUND OF THE INVENTION

Typical conductive pastes have been prepared by kneading a conductive powder in the presence of binding resins (binders) and solvents. Films such as electric resistive films and electroconductive films have been manufactured from such conductive pastes. The conductive powder and binder resins are not specifically limited in the variations and contents, but they are appropriately determined depending on the target values such as resistance or the like of the above-mentioned films. Typically, the conductive powder is selected from the group consisting of conductive carbon black and powders of metals such as gold, silver, copper, nickel, palladium and aluminum, or powders of alloys of these metals. The binding resins are selected from thermosetting resins such as phenolformaldehyde resin, xylene modified phenol resin, epoxy resin, melamine resin, and acrylic resin.

Recently however, electric resistive films etc. are required to have a higher heat-resistance to be used under high temperature conditions and to correspond with increasing heat output caused by the trend for smaller devices with higher capacitance. To solve this problem, conductive pastes using polyimide precursor resins as binding resins are disclosed (Unexamined Published Japanese Patent Application (Tokkai-Sho) 52-12459, Tokkai-Sho 54-78492, and Tokkai-Sho 54-136694). General polyimide precursors used for conductive pastes also are disclosed in Tokkai-Hei 3-233904, Tokkai-Hei 7-22214. Disclosures about improvement of properties of binding resins include an epoxy modified polyimide precursor (Tokkai-Sho 60-176006) and a siloxane modified polyimide precursor (Tokkai-Sho 58-7473).

However, in the above-mentioned polyimide precursors used for conductive pastes, the weight average degree of polymerization (n) is at least 70, that is, the polyimide precursors generally have a high molecular weight. Moreover, they have linear molecular structures and a high intermolecular cohesion. As a result, the polyimide precursors are less soluble in solvents, that is, they may be dissolved only in special solvents with high water absorptivity, and thus, only limited solvents can be used.

Since the above-mentioned polyimide precursors have less solvent solubility, a conductive paste manufactured by using such a polyimide precursor also will have a low solid content concentration inevitably. When such a conductive paste is used for screen printing, printing should be carried out several times since thick printing film cannot be obtained in a single printing step, so that printing and temporary drying should be repeated alternately up to forming a desired film thickness. This has generated serious problems in the manufacturing process, for example, it complicates the printing process, takes time and raises costs.

SUMMARY OF THE INVENTION

This invention aims to provide a conductive paste that has excellent printing properties and that can be used for manufacturing heat-resistant conductors or the like.

In order to achieve the purpose, a conductive paste of this invention, which comprises a conductive powder, a binder and a solvent, is characterized in that the binder is a polyimide precursor and the weight average degree of polymerization (n) of the polyimide precursor ranges from 5 to 20.

The inventors have found that a conductive paste having excellent printing properties can be manufactured by using as the binder the polyimide precursor with weight average degree of polymerization (n) ranging from 5 to 20. It generally is known that when the molecular weight of a polymer is lowered (e.g., the weight average degree of polymerization (n) is no more than 20) to improve the solvent solubility of the polymer, the solubility is improved but the polymer molecules are easily crystallized. When such a polymer is used as a binder for a conductive paste, portions of the polymer are crystallized after the steps of printing, drying and curing. Thus, irregularities occur on the printed surface, and the printing quality cannot be maintained. On the other hand, the polyimide precursor having a weight average degree of polymerization (n) controlled in the range from 5 to 20 has improved solubility and allows lowering the solution viscosity, and it is free of crystallization problem as mentioned above after printing when it is used for a conductive paste. The fact that problems of crystallization can be avoided even if the polyimide precursor has a low molecular weight to keep the weight average degree of polymerization in the range, has been found firstly by the inventors. Therefore, the conductive paste of this invention, having the polyimide precursor, has no specific limitation for the solvents, and it provides several excellent printing properties, such as decrease in printing cycles, cost reduction, better quality after printing and curing steps. The conductive paste of this invention, therefore, serves for manufacturing heat-resistant films including electric resistive films and electroconductive films.

It is more preferable in the conductive paste of this invention that the weight average degree of polymerization (n) of the polyimide precursor ranges from 5 to 6. When the polymerization degree (n) is less than 5, the polyimide precursor may be crystallized after curing the conductive paste. When the degree (n) exceeds 20, the solvent solubility may be lowered due to the high molecular weight.

A weight average degree of polymerization can be obtained by measuring the weight average molecular weight of a polyimide precursor with a gel permeation chromatography (GPC) analysis and by dividing the weight average molecular weight with the value of the molecular weight per constituent repeating unit of the polyimide precursor. The GPC analysis can be carried out, for example, by eluting the polyimide precursor at a flow rate of 1 ml/min, using GL-S300MDT-5 (supplied by Hitachi Chemical Co., Ltd.) as the GPC column and a dimethylformamide solution comprising 60 mM phosphoric acid and 30 mM lithium bromide as the eluent, before detecting it with a differential refractometer.

In the conductive paste of this invention, it is preferable that a constituent repeating unit of the polyimide precursor has a straight chain comprising at least three aromatic rings, with every three aromatic rings being linked together by at least one ether linkage. That is, for example, when there are at least three but less than six aromatic rings per constituent repeating unit, the constituent repeating unit preferably has at least one ether linkage therein, while there are at least six but less than nine aromatic rings per constituent repeating unit, the constituent repeating unit has at least two ether linkages therein. The positions of the ether linkages linking the aromatic rings are not limited specifically, but for example, the ether linkages can be positioned anywhere within the constituent repeating unit even when the constituent repeating unit has at least two ether linkages (i.e., the ether linkages can be positioned sequentially or separately on the straight chain within the constituent repeating unit). In a polyimide precursor having the constituent repeating unit with such a chemical structure, the percentage of ether linkages in the polyimide precursor molecules is relatively high, and the ether linkages provide folded structures in the molecules of the same precursor, and thus, interactions among the molecules are decreased. As a result, the solvent solubility of the polyimide precursor is further improved and the solution viscosity can be lowered.

It is preferable in the conductive paste of this invention that the polyimide precursor comprises a constituent repeating unit of at least one chemical structure of the following Formulas 1 and 2. The chemical structures shown in Formulas 1 and 2 are isomers, and the relative amounts of the respective isomers in this polyimide precursor are not specifically limited. Hereinafter, the polyimide precursor having such a structure is called 'polyimide precursor A'.

It is also preferable in the conductive paste of this invention that the polyimide precursor comprises a constituent repeating unit of at least one chemical structure of the following Formulas 3 and 4, and a constituent repeating unit of at least one chemical structure of the following Formulas 5 and 6. Hereinafter, the polyimide precursor having such structures is called 'polyimide precursor B'.

Formula 1

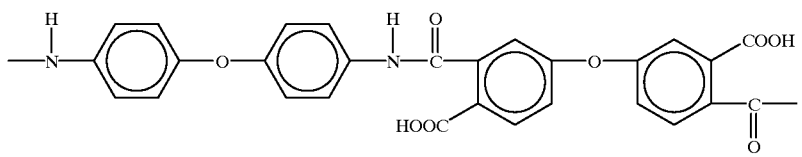

Formula 2

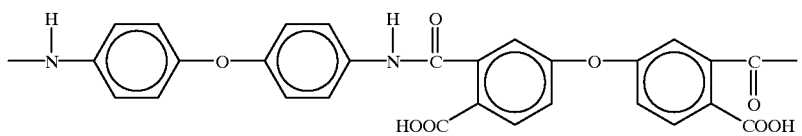

Formula 3

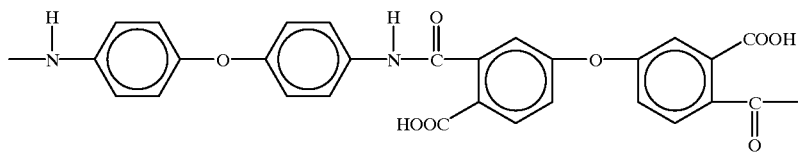

Formula 4

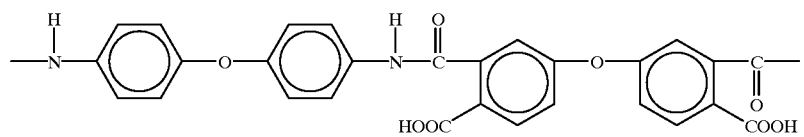

Formula 5

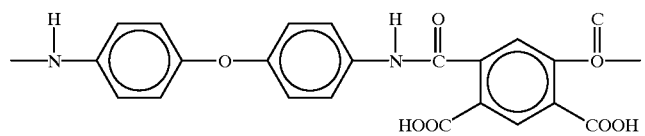

Formula 6

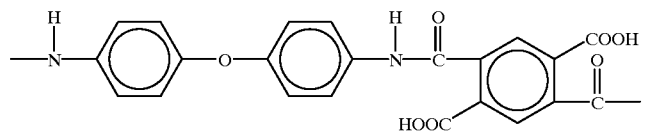

It is preferable that the relative amount of the constituent repeating unit of at least one chemical structure shown in Formulas 3 and 4 in the weight average degree of polymerization of the polyimide precursor B is at least 25% but less than 100%, while the relative amount of the constituent repeating unit of at least one chemical structure shown in Formulas 5 and 6 in the weight average degree of polymerization of the polyimide precursor B is more than 0% but not more than 75%. For example, when the weight average degree of polymerization (n) of the polyimide precursor B is ten, the relative amount of the constituent repeating unit shown in Formula 3 and 4 is 40%, and the relative amount of the constituent repeating unit shown in Formula 5 and 6 is 60%, the number (the polymerization degree) of the constituent repeating unit shown in Formula 3 and 4 is four while the number (the polymerization degree) of the constituent repeating unit shown in Formula 5 and 6 is six in a molecule of the polyimide precursor B. The polymerization order of the respective constituent repeating units in the polyimide precursor B is not specifically limited. The chemical structures shown in Formulas 3 and 4, and also the chemical structures shown in Formulas 5 and 6 are isomers respectively, and the relative amounts of the respective isomers in this polyimide precursor B are not specifically limited.

As mentioned above, crystallization will not occur even when the conductive paste of this invention comprises a low molecular weight polyimide precursor whose weight average degree of polymerization (n) is determined to be from 5 to 20. One of the possible reasons is as follows. Either an end anhydrous carboxyl group or an end amino group of a polyimide precursor molecule, as shown in the Formulas 1 to 6, is associated with an amino group, a carboxyl group or an anhydrous carboxyl group of another polyimide precursor molecule during the printing of the conductive paste, and reacted at curing, so that the molecules are linked in a noncrystalline condition.

The conductive paste of this invention preferably comprises solid contents in the range from 40 to 55%, more preferably, from 45 to 51%. The viscosity is preferably in the range from 20 to 60 Pa·s, more preferably, from 25 to 55 Pa·s. The solid content rate and the viscosity can be measured by methods discussed later, though the methods are not specifically limited.

DETAILED DESCRIPTION OF THE PREFERRED EMBODIMENT

As mentioned above, a conductive paste of this invention comprises the polyimide precursor, a conductive powder, and a solvent.

As the polyimide precursor in the conductive paste of this invention has an excellent solvent solubility, the solvents are not specifically limited. For example, a polar solvent (a solvent with a relatively high water absorptivity), a mixed solvent comprising a polar solvent and a nonpolar solvent (a solvent with a relatively low water absorptivity) or the like can be used. The mixed solvent comprising a polar solvent and a nonpolar solvent is used preferably. When this mixed solvent is used for the conductive paste, the obtained conductive paste will have much better printing properties, being free of possibilities such as lowering solubility of the binder, deposition of the binder, and variations in the viscosity of the conductive paste, which are caused by the solvent absorbing the moisture in the air.

The polar solvent (the solvent with relatively high water absorptivity) and the nonpolar solvent (the solvent with relatively low water absorptivity) are mixed preferably in the volume ratio from 10:0 to 0.5:9.5, more preferably, from 7:3 to 1:9, and most preferably, from 5:5 to 1:9.

Examples of the polar solvents include N-methyl-2-pyrrolidone; N,N-dimethylsulfoxide; N,N-dimethylformamide; N,N-diethylformamide; N,N-dimethylacetamide; N,N-diethylacetamide; hexamethylenephosphoamide; butyrolactone; and propylene carbonate. These polar solvents can be used alone or can be mixed with a nonpolar solvent. Examples of the nonpolar solvents include diethylene glycol dimethyl ether; diethylene glycol methyl ether; diethylene glycol diethyl ether; diethylene glycol dibutyl ether; triethylene glycol monomethyl ether; triethylene glycol monoethyl ether; isophorone; diacetone alcohol; dimethyl succinate; dimethyl glutarate; and dimethyl adipate. In a use as a mixed solvent, there is no special limitation for the combination of the polar solvents and the nonpolar solvents. Each one of the solvents to be mixed can be selected from the two groups, or more than two kinds of solvents can be used together.

Among the above-identified solvents, a mixed solvent comprising N-methyl-2-pyrrolidone and diethylene glycol dimethyl is preferred. Preferably in the solvent, N-methyl-2-pyrrolidone and diethylene glycol dimethyl ether are mixed in the volume ratio from 2:8 to 9:1, more preferably, from 2:8 to 7:3, and most preferably, from 2:8 to 3:7.

Examples of the conductive powders in the conductive paste of this invention include conductive carbon black, powders of metals such as gold, silver, copper, nickel, palladium and aluminum and a powder of alloys of these metals.

In addition to the above-identified conductive powders, solvents and polyimide precursors, the conductive paste of this invention can include some other ingredients such as a non-conductive powder and various additives.

Examples of the non-conductive powders can include powders of silica, alumina, glass, talc, clay, aluminum hydroxide, asbestos, titanium dioxide and zinc white. Examples of the additives can include defoaming agents, coupling agents and dispersants. The addition amounts of the additives are not limited specifically as long as they do not deteriorate the function of the conductive paste of this invention.

The polyimide precursor can be manufactured by any conventional methods without any specific limitations. The following is an example of a method for manufacturing polyimide A having a weight average degree of polymerization (n) ranging from 5 to 6, from oxydiphthalic anhydride and 4,4'-diamino diphenyl ether.

In one embodiment, a mixed solvent comprising N,N-dimethylacetamide and diethylene glycol monomethyl ether (weight ratio ranges from 6:4 to 5:5) and oxydiphthalic anhydride as a first material are introduced into a reaction flask having a cooling condenser, a thermometer, an agitator and a gas-injection tube, so that the weight ratio of the mixed solvent to the oxydiphthalic anhydride ranges from 10:1 to 12:1. Nitrogen gas is filled in the flask and the solvent and the first material are agitated to form a mixture under the nitrogen atmosphere at temperatures from 40 to 50° C. The mixture is cooled, and to which 4,4'-diamino diphenyl ether as a second material is added at a temperature of about 10° C., so that the weight ratio of the second material to the first material ranges from 98:100 to 99:100. The mixture is aged at a room temperature for about 20 hours, and injected in ice water to deposit a solid content. The obtained solid content is pulverized, and the powder is dipped for about 15 hours in a methanol/water solvent with a volume ratio from 9:1 to 5:5. Later, the powder is filtered and dried at about 80° C. in a dryer. In this way, the polyimide precursor A having a weight average degree of polymerization (n) ranging from 5 to 6 is manufactured. More specifically, about 300 g of polyimide precursor A having a weight average degree of polymerization (n) from 5 to 6 can be obtained under the above-mentioned condition from 1500 g of N,N-dimethylacetamide, 186 g of oxydiphthalic anhydride, and 118 g of 4,4'-diamino diphenyl ether. The weight average degree of polymerization can be adjusted by varying the mixture ratio of the mixed solvent under the above-mentioned condition. More specifically, for example, the polymerization degree can be increased as the content rate of N,N-dimethylacetamide in the mixed solvent is raised.

The polyimide precursor B can be prepared by using, for example, oxydiphthalic anhydride, 4,4'-diamino diphenyl ether and pyromellitic dianhydride as the materials blended in the ratio, for example, ranging from 99:99:1 to 1:99:99. The method for preparing the polyimide B is not specifically limited, but the polyimide B can be prepared, for example, in the same manner as the polyimide precursor A. When two kinds of constituent repeating units (except for the isomers) are included as in the case of the polyimide precursor B, the ratio of the constituent repeating units can be calculated by conducting a mass spectrometry etc. to obtain the molar ratios of elemental carbon and elemental hydrogen to that of elemental nitrogen.

The polyimide precursor of this invention can be used alone or together with at least one other polyimide precursor.

The conductive paste of this invention can be manufactured, for example, by dissolving, kneading and mixing the conductive powder, the polyimide precursor and the solvent, using a three-roll mill, a sand mill or the like.

The mixture rate of the solvent and the polyimide precursor is appropriately determined depending on the kinds of the solvent and the polyimide precursor. In one embodiment, the polyimide precursor ranges from 50 to 80 weight parts, more preferably, from 55 to 65 weight parts to 100 weight parts of the solvent.

Though there are no specific limitations for the mixture rate of the conductive powder, for example, it ranges from 20 to 80 weight parts, more preferably, from 25 to 70 weight parts to 100 weight parts of the polyimide precursor.

The mixture rate of the non-conductive powder is not limited specifically as long as it does not affect adversely the function of the conductive paste of this invention. In one embodiment, it ranges from 0 to 35 weight parts, more preferably, from 0 to 20 weight parts to 100 weight parts of the polyimide precursor.

In a use of the conductive paste of this invention, for example, the conductive paste is screen-printed on an insulating substrate formed with an electrode and dried, before being heated for one to two hours at temperatures ranging from 270 to 350° C. for curing.

Examples of this invention are described below along with Comparative Examples.

EXAMPLE 1

Solvent solubility of polyimide precursors and hygroscopicity of mixed solutions comprising the polyimide precursors and the solvents were tested. The polyimide precursors and the testing procedures are shown below.
(Polyimide precursors)

Polyimide precursor A (weight average degree of polymerization (n)=5–6)
Polyimide precursor A (weight average degree of polymerization (n)=20)
Polyimide precursor B (weight average degree of polymerization (n)=5–6)
Polyimide precursor B (weight average degree of polymerization (n)=20)

The relative amount of the constituent repeating unit of the chemical structure shown in Formulas 3 and 4 in the weight average degree of polymerization of the polyimide precursor B is 40%, while the relative amount of the constituent repeating unit of the chemical structure shown in Formulas 5 and 6 in the weight average degree of polymerization of the polyimide precursor B is 60%.

(Solubility test)

N-methyl-2-pyrrolidone and diethylene glycol dimethyl ether were mixed to make mixed solvents having predetermined volume ratios of a:b (10:0, 9:1, 3:7, 2:8, 1:9 and 0:10). 10 g of each mixed solvent, 5 g of each polyimide precursor and steel balls 2 mm in diameter were filled in a chemical resistant plastic container having a capacity of 50 ml, and mixed with a shaker (Paint Conditioner supplied by Dead Devil) under a condition where shaking was carried out 250 times per minute for 150 minutes. The mixed solutions were evaluated after being shaken, and the results are shown in the following Table 1. In the Table 1, ○ indicates that a solution was transparent, Δ indicates that a solution was cloudy and × indicates that the polyimide precursor was not dissolved.

(Hygroscopicity test)

A solvent comprising N-methyl-2-pyrrolidone and diethylene glycol dimethyl ether in a volume ratio of 3:7 was mixed with each polyimide precursor in the same manner as the above-mentioned solubility test. These mixed solutions were weighed to be 50 g in a glass laboratory dish 5 cm in diameter, and left without being covered under a circumstance of 40° C. 80% RH for two hours before the moisture rate (%) was measured by a Karl Fischer method. The results are also shown in the Table 1.

COMPARATIVE EXAMPLE 1

Solubility was tested in the same manner as Example 1 except that U-vanish (weight average degree of polymerization (n)=100, supplied by Ube Industries, Ltd.) and Toraynees (weight average degree of polymerization (n)=70, supplied by TORAY INDUSTRIES, INC.) were used (Tokkai-Hei 3-233904 and Tokkai-Hei 7-22214) respectively for the polyimide precursors. Hygroscopicity was tested in the same manner as Example 1 except that only N-methyl-2-pyrrolidone was used for the solvent. The results are also shown in Table 1.

TABLE 1

| | Polyimide precursor | Polymerization degree (n) | Volume ratio of solvent (a:b) | | | | | | Hygroscopicity test (%) |
|---|---|---|---|---|---|---|---|---|---|
| | | | 10:0 | 9:1 | 3:7 | 2:8 | 1:9 | 0:10 | |
| Example 1 | A | 5–6 | ○ | ○ | ○ | ○ | Δ | x | 3.2 |
| | A | 20 | ○ | ○ | ○ | ○ | x | x | 3.4 |
| | B | 5–6 | ○ | ○ | ○ | ○ | Δ | x | 3.5 |
| | B | 20 | ○ | ○ | ○ | ○ | Δ | x | 3.2 |
| Com. Ex. 1 | U-Vanish | 100 | ○ | x | x | x | x | x | 8.4 |
| | Toraynees | 70 | ○ | x | x | x | x | x | 9.2 |

Com. Ex.: Comparative Example

As shown in Table 1, in Example 1, the weight average degrees of polymerization (n) of the polyimide precursors were determined to be 5–6 and 20, so that the solubility in the mixed solvents was improved compared to the polyimide precursors (degree of polymerization (n)=100 or 70) in Comparative Example 1. With regard to the hygroscopicity, the polyimide precursors used in Example 1 were soluble in the mixed solvents, and thus, the moisture rates of the solutions mixed with polyimide precursor were lower than that of the polyimide precursor mixed solution of the Comparative Example 1 in which only N-methyl-2-pyrrolidone was used for dissolving. This means that the hygroscopicity was able to be controlled.

EXAMPLE 2

Conductive pastes were prepared by blending the respective polyimide precursors as shown in Example 1, a conductive powder (carbon black), and a mixed solvent comprising N-methyl-2-pyrrolidone and diethylene glycol dimethyl ether (volume ratio was 7:3), kneading and mixing by a three-roll mill.

| | |
|---|---|
| Polyimide precursor (solid) | 100 weight parts |
| Carbon black | 50 weight parts |
| (Acetylene black supplied by DenkaKogyou) | |
| Mixed solvent | 190 weight parts |

COMPARATIVE EXAMPLE 2

Solutions mixed with polyimide precursors were prepared by using U-vanish and Toraynees for the respective polyimide precursors as in Comparative Example 1, which were mixed and dissolved in an N-methyl-2-pyrrolidone solvent up to 20 weight %. They were blended to have the following composition to make conductive pastes in the same manner as Example 2.

| | |
|---|---|
| Solution mixed with polyimide precursor | 500 weight parts |
| Carbon black | 50 weight parts |

(Acetylene black supplied by DenkaKogyou)

COMPARATIVE EXAMPLE 3

A conductive paste was prepared in the same manner as Example 2 except that a polyimide precursor had the same constituent repeating unit as the polyimide precursor A and its weight average degree of polymerization (n) was 3–4.

Properties of the respective conductive pastes obtained in Example 2 and Comparative Examples 2 and 3 were examined in the following manner.

(Solid content rate)

Solid content rates for the respective conductive pastes were measured with a heat-weight reduction measurement evaluator (weight reduction measurement accuracy: 1 mg; AD-4715 supplied by A&D CO., LTD.). Each conductive paste (2 g) was heated at 160° C., and the weight reduction rate per minute (weight reduction rate to 2 g of unheated conductive paste) was measured with the evaluator. The measurement was completed when the weight reduction rate became 0.05% or less. The solid content rate was calculated in accordance with the following equation from the weight of the conductive paste at the time of the completion of measurement and that of the unheated conductive paste. The results are shown in Table 2.

Solid content rate (%)=100×A/B

A: weight of heated conductive paste

B: weight of unheated conductive paste (Viscosity)

Viscosity for each conductive paste was measured by using a cone-plate type viscometer (FLUIDS SPECTROMETER RFS II supplied by Leometric). The cone was 25 mm in diameter and the angle formed by the cone surface and the plate was 0.1 radians. For the measurement, the speed in shearing the samples was determined to be $10\ s^{-1}$, and the sample temperature was 25° C. The viscosity value was a measurement result taken 60 seconds after the beginning of the shearing. The results also are shown in Table 2.

(Screen printing)

Ceramic insulating substrates were prepared by baking silver pastes to form electrodes. On the electrode-formed surfaces of the substrates, conductive pastes were printed respectively by using a screen printing machine (a small universal screen printing machine MR-60 supplied by Sakurai Graphic systems) and a 200-mesh screen, and they were dried. These printing and drying steps were repeated until the dried conductive paste printed films became 10±1 μm thick and were cured by treating for one hour at 350° C., so that polyimide resin conductive samples were obtained. Table 2 shows also the printing cycles required for controlling the conductive paste printing film to be 10±1 μm thick.

(Measurement of resistance)

Initial resistance of each polyimide resin conductive sample obtained by the screen printing was measured, and a resistance of the same sample was measured after heating it in order to obtain resistance change rate (reduction rate). The resistance was measured by contacting a tester (digital multimeter VP-2662A supplied by Matsushita Electric Industries Co., Ltd.) to the electrode portions of the polyimide resin conductive samples. The resistance was measured again in the same manner after heating the polyimide resin conductive samples at 200° C. for 500 hours and leaving them for 30 minutes. The results are also shown in Table 2.

TABLE 2

|  | Polyimide precursor | Polymerization degree (n) | Solid content rate (%) | Viscosity (Pa-s) | Printing cycle (n) | Initial resistance (kΩ) | Resistance change rate (%) |
| --- | --- | --- | --- | --- | --- | --- | --- |
| Example 2 | A | 5–6 | 44.1 | 36.0 | 2 | 3.29 | 3.5 |
|  | A | 20 | 44.1 | 56.0 | 2 | 3.45 | 3.9 |
|  | B | 5–6 | 44.1 | 42.0 | 2 | 1.20 | 3.2 |
|  | B | 20 | 44.1 | 55.0 | 2 | 1.32 | 2.8 |
| Com. Ex. 2 | U-Vanish | 100 | 27.3 | 16.0 | 6 | 3.50 | 3.5 |
|  | Toraynees | 70 | 27.3 | 14.5 | 6 | 3.25 | 4.0 |
| Com. Ex. 3 | A | 3–4 | 44.1 | 27.0 | 3 | N.M | N.M |

N.M: not measurable
Com. Ex.: Comparative Example

EXAMPLE 3

Conductive pastes were manufactured in the same manner as Example 2 except that the solvent for preparing the conductive paste was a mixture of N-methyl-2-pyrrolidone and diethylene glycol dimethyl ether (volume ratio was 3:7). Properties of these conductive pastes were tested in the above-mentioned manner. The results are shown in Table 3.

COMPARATIVE EXAMPLE 4

A conductive paste was manufactured in the same manner as Comparative Example 3 except that the solvent for preparing the conductive paste was a mixture of N-methyl-2-pyrrolidone and diethylene glycol dimethyl ether (volume ratio was 3:7). Properties of these conductive pastes were tested in the above-mentioned manner. The results also are shown in Table 3.

TABLE 3

|  | Polyimide precursor | Polymerization degree (n) | Solid content rate (%) | Viscosity (Pa-s) | Printing cycle (n) | Initial resistance (kΩ) | Resistance change rate (%) |
| --- | --- | --- | --- | --- | --- | --- | --- |
| Example 3 | A | 5–6 | 40.0 | 24.0 | 2 | 3.09 | 3.7 |
|  | A | 20 | 40.0 | 45.0 | 2 | 3.15 | 3.5 |
|  | B | 5–6 | 40.0 | 29.0 | 2 | 1.10 | 3.4 |
|  | B | 20 | 40.0 | 40.0 | 2 | 1.42 | 2.6 |
| Com. Ex. 4 | A | 3–4 | 40.0 | 23.0 | 3 | N.M | N.M |

N.M: not measurable
Com. Ex.: Comparative Example

As shown in Tables 2 and 3, the conductive pastes in Examples 2 and 3 were provided successfully to have viscosity and solid content rate suitable for printing. As a result, printing cycles also were reduced to one-third of the conductive pastes in Comparative Example 2, and the productivity was improved. Polyimide resin conductive samples made of the conductive pastes in Examples 2 and 3 had a sufficient heat resistance, since, even after the heating treatment, the resistance change rate was controlled to be the same or smaller compared to those of the polyimide resin conductive samples in Comparative Example 2 in which conventional polyimide precursors were used. Tables 2 and 3 show that the conductive pastes and conductive samples in Examples 2 and 3 had substantially similar effects even when the mixing rate of the solvents was varied.

Meanwhile the conventional polyimide precursors used in Comparative Example 2 had less solvent solubility, and the resulting conductive paste had a low solid content rate inevitably. This required many printing cycles. The conductive pastes in Comparative Examples 3 and 4 had the same constituent repeating unit as the polyimide precursor A of this invention, and they include low molecular weight polyimide precursors whose weight average degrees of polymerization (n) were 3–4. Such conductive pastes had an excellent solvent solubility, and can be adjusted to have solid content rate and viscosity of the conductive pastes of Examples, as shown in Tables 2 and 3. In the steps of drying and curing after printing, however, the printed surface had irregularities due to partial crystallization of the polyimide precursor, and thus, measurement of the resistance of the polyimide resin conductive samples was impossible. In conclusion, the conductive pastes in Comparative Examples 3 and 4 failed to maintain printing qualities.

As mentioned above, the conductive paste of this invention, including a polyimide precursor as a binder having a weight average degree of polymerization (n) ranging from 5 to 20, has no specific limitations in applicable solvents while it has excellent printing properties. Therefore, the conductive paste is suitable for manufacturing resistance films with heat resistance, or the like.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. A conductive paste comprising a conductive powder, a binder and a solvent, wherein the binder is a polyimide precursor, which has a straight chain comprising at least three aromatic rings, with every three aromatic ring being linked together with at least one ether linkage and the weight average degree of polymerization (n) of the polyimide precursor ranges from 5 to 20.

2. The conductive paste according to claim 1, wherein the polyimide precursor comprises a constituent repeating unit of at least one chemical structure shown in Formulas 1 and 2:

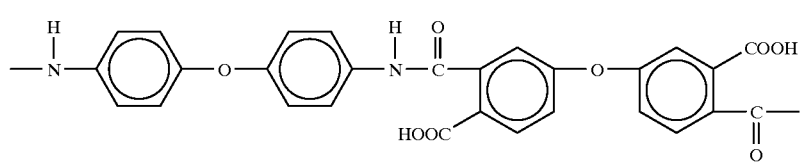

Formula 1

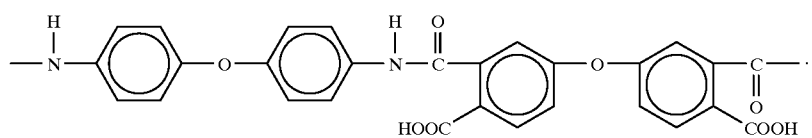

Formula 2

3. The conductive paste according to claim 1, wherein the polyimide precursor comprises a constituent repeating unit of at least one chemical structure shown in Formulas 3 and 4, and a constituent repeating unit of at least one chemical structure shown in Formulas 5 and 6:

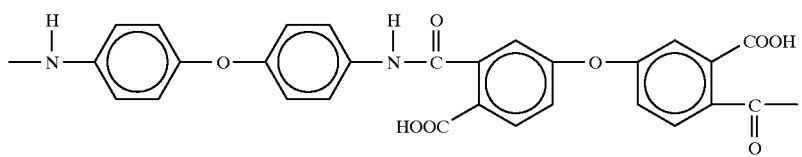

Formula 3

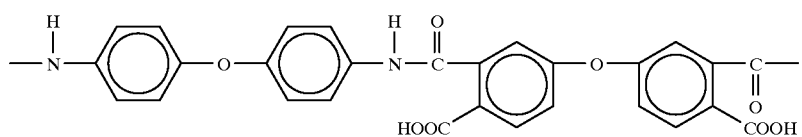

Formula 4

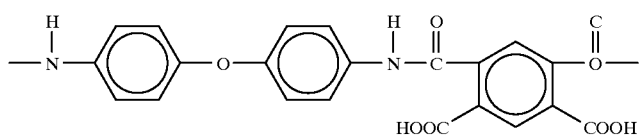

Formula 5

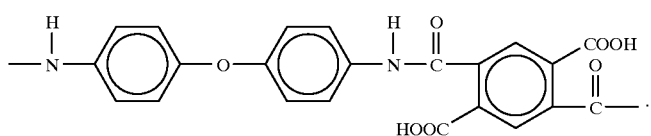

Formula 6

4. The conductive paste according to claim 3, wherein the relative amount of the constituent repeating unit of at least one chemical structure shown in Formulas 3 and 4 in the weight average degree of polymerization of the polyimide precursor is at least 25% but less than 100%, while the relative amount of the constituent repeating unit of at least one chemical structure shown in Formulas 5 and 6 in the weight average degree of polymerization of the polyimide precursor is more than 0% but not more than 75%.

5. The conductive paste according to claim 1, wherein an amount of the polyimide precursor in the range from 50 to 80 weight parts is blended with 100 weight parts of the solvent.

6. The conductive paste according to claim 1, the solvent is either a polar solvent or a mixed solvent comprising a polar solvent and a nonpolar solvent.

7. The conductive paste according to claim 6, wherein the polar solvent is at least one selected from the group consisting of N-methyl-2-pyrrolidone; N,N-dimethylsulfoxide; N,N-dimethylformamide; N,N-diethylformamide; N,N-dimethylacetamide; N,N-diethylacetamide; hexamethylenephosphoamide; butyrolactone; and propylene carbonate.

8. The conductive paste according to claim 6, wherein the nonpolar solvent is at least one selected from the group consisting of diethylene glycol dimethyl ether; diethylene glycol methyl ether; diethylene glycol diethyl ether; diethylene glycol dibutyl ether; triethylene glycol monomethyl ether; triethylene glycol monoethyl ether; isophorone; diacetone alcohol; dimethyl succinate; dimethyl glutarate; and dimethyl adipate.

9. The conductive paste according to claim 6, wherein the polar solvent and the nonpolar solvent are mixed to have a volume ratio ranging from 10:0 to 0.5:9.5.

10. The conductive paste according to claim 6, wherein the polar solvent and the nonpolar solvent are mixed to have a volume ratio ranging from 7:3 to 1:9.

11. The conductive paste according to claim 1, wherein the solvent is a mixture of N-methyl-2-pyrrolidone and diethylene glycol dimethyl ether.

12. The conductive paste according to claim 11, wherein the N-methyl-2-pyrrolidone and diethylene glycol dimethyl ether are mixed to have a volume ratio ranging from 2:8 to 9:1.

13. The conductive paste according to claim 12, wherein the N-methyl-2-pyrrolidone and diethylene glycol dimethyl ether are mixed to have a volume ratio ranging 2:8 to 7:3.

14. The conductive paste according to claim 1, having a solid content rate that ranges from 40 to 55%.

15. The conductive paste according to claim 1, having a viscosity that ranges from 20 to 60 Pa·s.

16. The conductive paste according to claim 1, comprising a non-conductive powder.

* * * * *